(12) United States Patent
Chen et al.

(10) Patent No.: US 11,468,590 B2
(45) Date of Patent: Oct. 11, 2022

(54) WIRELESS SUBSTRATE-LIKE TEACHING SENSOR FOR SEMICONDUCTOR PROCESSING

(71) Applicant: CyberOptics Corporation, Golden Valley, MN (US)

(72) Inventors: Ferris J. Chen, Taichung (TW); David W. Duquette, Minnetonka, MN (US); Robert M. Mark, Minnetonka, MN (US)

(73) Assignee: CyberOptics Corporation, Golden Valley, MN (US)

( * ) Notice: Subject to any disclaimer, the term of this patent is extended or adjusted under 35 U.S.C. 154(b) by 0 days.

(21) Appl. No.: 16/389,354

(22) Filed: Apr. 19, 2019

(65) Prior Publication Data

US 2019/0325601 A1 Oct. 24, 2019

Related U.S. Application Data

(60) Provisional application No. 62/661,944, filed on Apr. 24, 2018.

(51) Int. Cl.
*G06T 7/13* (2017.01)
*G01B 11/14* (2006.01)
(Continued)

(52) U.S. Cl.
CPC ............... *G06T 7/70* (2017.01); *B25J 9/163* (2013.01); *B25J 9/1697* (2013.01);
(Continued)

(58) Field of Classification Search
CPC ............ G06T 7/70; G06T 2207/10024; G06T 2207/30148; G06T 2207/30164;
(Continued)

(56) References Cited

U.S. PATENT DOCUMENTS 5,497,007 A * 3/1996 Uritsky ............... H01J 37/3045
250/491.1
6,553,277 B1 * 4/2003 Yagisawa .......... H01L 21/67253
700/204
(Continued)

FOREIGN PATENT DOCUMENTS

JP 2004276151 A 10/2004
JP 2017207288 A 11/2017
(Continued)

OTHER PUBLICATIONS

International Search Report and Written Opinion for International Patent Application No. PCT/US2019/028464, dated Sep. 25, 2019, date of filing: Apr. 22, 2019, 10 pages.

(Continued)

*Primary Examiner* — Albert Kir
(74) *Attorney, Agent, or Firm* — Christopher R. Christenson; Kelly, Holt & Christenson, PLLC

(57) ABSTRACT

A wireless substrate-like sensor for teaching transfer coordinates to a robotic substrate handling system is provided. The sensor includes a base portion sized and shaped like a substrate handled by the robotic substrate handling system. An electronics housing is coupled to the base portion. A power module is disposed within the electronics housing and configured to power components of the sensor. At least one edge camera is disposed near an edge of the base portion. The at least one edge camera has a field of view that images an alignment feature of the object within the field of view of the at least one edge camera of the wireless substrate-like sensor. A controller is disposed within the electronics housing and is coupled to the at least one edge camera. The controller is configured to obtain an image from the at least one edge camera and determine a location of the alignment (Continued)

feature and provide the determined location to the robotic substrate handling system.

36 Claims, 6 Drawing Sheets

(51) Int. Cl.
| | | |
|---|---|---|
| *G06T 7/70* | (2017.01) | |
| *H01L 21/68* | (2006.01) | |
| *G06N 20/00* | (2019.01) | |
| *G05B 19/042* | (2006.01) | |
| *B25J 9/16* | (2006.01) | |
| *G06T 7/80* | (2017.01) | |
| *G06T 7/00* | (2017.01) | |
| *H04N 5/247* | (2006.01) | |
| *H01L 21/687* | (2006.01) | |

(52) U.S. Cl.
CPC .......... *G05B 19/042* (2013.01); *G06N 20/00* (2019.01); *G06T 7/0004* (2013.01); *G06T 7/80* (2017.01); *H01L 21/681* (2013.01); *H04N 5/247* (2013.01); *G05B 2219/2602* (2013.01); *G06T 2207/10024* (2013.01); *G06T 2207/30148* (2013.01); *G06T 2207/30164* (2013.01); *H01L 21/68707* (2013.01)

(58) Field of Classification Search
CPC . G06N 20/00; H01L 21/681; H01L 21/68707; H04N 5/247; B25J 9/163; B25J 9/1697; G05B 19/042; G05B 2219/2602
USPC .......................................................... 348/87
See application file for complete search history.

(56) References Cited

U.S. PATENT DOCUMENTS

| | | | |
|---|---|---|---|
| 7,100,954 B2 | 9/2006 | Klein et al. | |
| 7,283,255 B2* | 10/2007 | Ramsey | ............ H01L 21/67259 356/614 |
| 8,823,933 B2 | 9/2014 | Bonciolini et al. | |
| 9,268,739 B2 | 2/2016 | Akada | |
| 9,934,565 B2 | 4/2018 | Amanullah | |
| 10,128,140 B2 | 11/2018 | Lin | |
| 2003/0027494 A1* | 2/2003 | Yang | .................... B23D 59/001 451/6 |
| 2003/0202092 A1 | 10/2003 | Sadighi et al. | |
| 2006/0000964 A1 | 1/2006 | Ye et al. | |
| 2007/0268495 A1* | 11/2007 | Rinn | ....................... G01B 11/03 356/508 |
| 2007/0268496 A1* | 11/2007 | Boesser | ............. G01B 9/02007 356/508 |
| 2010/0030347 A1* | 2/2010 | Shindo | .............. H01L 21/67259 700/59 |
| 2015/0147148 A1* | 5/2015 | Coady | ............... H01L 21/68707 414/744.2 |
| 2015/0287625 A1* | 10/2015 | Fujimoto | .................. G06T 7/73 382/151 |
| 2017/0264885 A1 | 9/2017 | Haugan | |
| 2017/0287703 A1* | 10/2017 | Amano | .................. G03B 17/08 |
| 2019/0033103 A1* | 1/2019 | Sugita | ................. H01L 21/6833 |
| 2019/0172742 A1* | 6/2019 | Mochizuki | ............. B25J 9/1697 |
| 2020/0124406 A1* | 4/2020 | Gorschenew | ...... G01N 21/8806 |
| 2021/0012482 A1* | 1/2021 | Yoshida | ............. G01N 21/9503 |
| 2021/0103226 A1* | 4/2021 | Murayama | ............ G03F 9/7092 |
| 2021/0351057 A1* | 11/2021 | Tamura | ................. H01L 21/681 |
| 2021/0407844 A1* | 12/2021 | Ushiku | ............. H01L 21/67748 |

FOREIGN PATENT DOCUMENTS

| | | |
|---|---|---|
| JP | 201910728 A | 6/2019 |
| KR | 20090051423 A | 5/2009 |
| KR | 20130125158 A | 11/2013 |

OTHER PUBLICATIONS

Written Opinion dated Jun. 4, 2021 for Singaporean Patent Application No. 11202010495Q, 6 pages.
Search Report dated Dec. 6, 2021 for European Patent Application No. 19793158.7, 9 pages.
Office Action dated Dec. 14, 2021 for Japanese Patent Application No. 2020-559518, 11 pages, English translation included.
Office Action dated Jan. 24, 2022 for Korean Patent Application No. 10-2020-7031063, 14 pages including English translation.

* cited by examiner

FIG. 1A
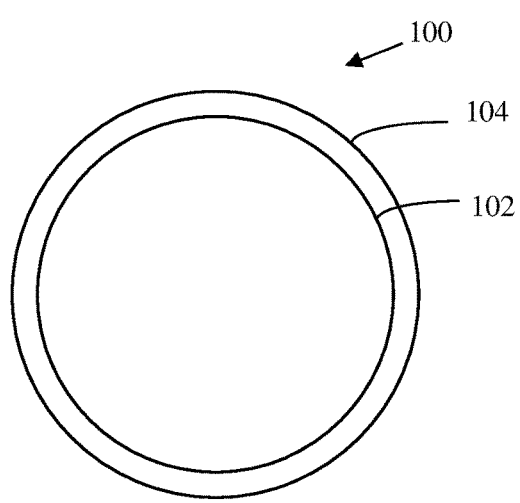
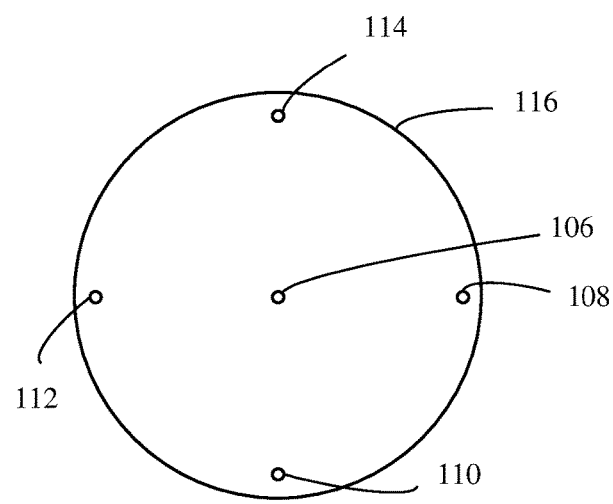
FIG. 1C
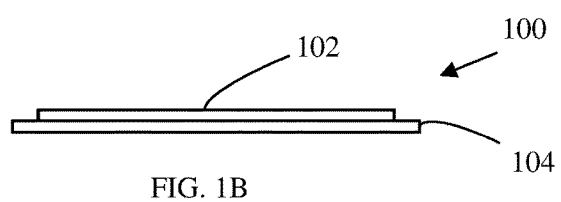
FIG. 1B ial Patent Application Ser. No. 62/661,944,
WIRELESS SUBSTRATE-LIKE TEACHING SENSOR FOR SEMICONDUCTOR PROCESSING

CROSS-REFERENCE TO RELATED APPLICATIONS

The present application is based on and claims the benefit of U.S. Provisional Patent Application Ser. No. 62/661,944, filed Apr. 24, 2018, the content of which is hereby incorporated by reference in its entirety.

BACKGROUND

Virtually all modern electronics use integrated circuits. These integrated circuits are produced using a semiconductor material, such as silicon, in a semiconductor processing facility. The semiconductor is generally provided in the form of a round, thin wafer that is processed into potentially hundreds or thousands of integrated circuits.

The semiconductor processing facility uses automated robots to handle material inside the processing chamber. Wafers must be positioned for processing with high accuracy and repeatability. Wafers must be returned to their storage locations carefully to avoid collisions that can produce debris; the processing environment is required to be extremely clean, since debris or dust can have a significant negative impact on processing yield.

Wafer handling systems for semiconductor processing can take many forms. These systems are employed to remove a wafer from a storage pod, move a wafer to a processing station, move a wafer between processing stations and/or return the processed wafer to the pod. Typically, the wafer handling system includes a robotic arm having an end effector that is shaped and sized to be inserted into the pod for wafer removal/replacement. The end effector may include a vacuum system for gripping or otherwise adhering to the wafer to ensure that it does not slide or shift during transport.

The end effector must be positionable with precision. Positioning errors in the wafer handling system can cause inadvertent contact between wafers, the end effector and/or other components of the semiconductor processing system. Even minor impacts can dislodge particles that may contaminate other wafers resulting in very costly scrap.

In some processing steps, it is necessary to center the wafer very accurately on the processing tool to assure uniform process results across the wafer surface. Accordingly, handling system positioning errors must be minimized.

During semiconductor processing, a wafer will generally need to be transferred to and properly positioned on a platform generally called the 'process chuck'. A process chuck is a device that holds a wafer during one or more process steps. It is often close to the size and circular shape of the wafer. The chuck may also have vacuum apertures such that when the wafer is placed upon the process chuck, it can be held securely thereto using vacuum. If a wafer is not placed correctly on the process chuck, the edge dies of the wafer will not be processed correctly. These dies will have defects, resulting in loss of yield. For some processing steps, such as ion etching and others, the chuck may include special sidewalls that help guide the process. The wafer must be placed very accurately within the sidewalls for the process to be successful.

In order to reduce positional errors, it is useful periodically to re-align the wafer handling system to known markers in the process tool, the wafer storage and transfer pod, or both. This is commonly called 'teaching' of wafer transfer coordinates to the wafer handling system in order to reduce or eliminate any disparities between the wafer handling system's coordinate system and the coordinate system of the semiconductor processing system. One commercially available system is sold under the trade designation WaferSense ATS by CyberOptics Corporation of Golden Valley, Minn. The WaferSense ATS (Auto-Teaching System), uses machine vision to provide a calibrated "eye" that helps teach wafer transfer coordinates to a wafer handling system. This system employs a sensor that is shaped like a wafer so that it can be handled exactly like a process wafer. In this way, the sensor can be moved about the semiconductor processing system to measure robot handoffs without opening the process chamber. Opening and closing the process chamber can be an expensive hours- to days-long interruption in production. A wafer-like sensor also can access difficult-to-reach stations like pre-aligners and load locks. The WaferSense ATS sensor is taught to recognize circular target features, such as a central hole in the chuck, and uses machine vision and its on-board signal processing to measure X-Y-Z offset from the sensor's calibrated geometric center to the center of the target feature. The ATS sensor allows equipment users to save the time during equipment maintenance without opening chamber and the accurate robot teaching ensures the wafer is transferred properly to the center of the process chuck.

The current ATS sensor requires a round shape target in the center of the wafer chuck so the ATS can use it for calculating the deviation between the wafer and the chuck. Also, the robot blade or end effector needs to have an unobstructed opening or port so the camera of ATS sensor can see through it to find the round shape of the process chuck. However, a significant percentage of semiconductor processing equipment (~>70%) does not have the round shape target on the process chuck or the end effector does not have the required central opening. In these cases, the current ATS sensor is limited and may not be suitable for teaching wafer transfer coordinates to the wafer handling system. Accordingly, it is beneficial to provide an automatic teaching sensor for wafer handling systems that can perform the teach function without a central aperture of a process chuck or a central opening in the end effector. Such a sensor would allow the benefits of automatic wafer transfer coordinate teaching to reach more applications.

SUMMARY

A wireless substrate-like sensor for teaching transfer coordinates to a robotic substrate handling system is provided. The sensor includes a base portion sized and shaped like a substrate handled by the robotic substrate handling system. An electronics housing is coupled to the base portion. A power module is disposed within the electronics housing and configured to power components of the sensor. At least one edge camera is disposed near an edge of the base portion of the wireless substrate-like sensor. The at least one edge camera has a field of view that images an alignment feature of the object within the field of view of the at least one edge camera of the wireless substrate-like sensor. A controller is disposed within the electronics housing and is coupled to the at least one edge camera. The controller is configured to obtain an image from the at least one edge camera and determine a location of the alignment feature and provide the determined location to the robotic substrate handling system.

BRIEF DESCRIPTION OF THE DRAWINGS

FIGS. 1A-1C are diagrammatic views of a substrate-like sensor with process chuck edge detection in accordance with one embodiment of the present invention.

DETAILED DESCRIPTION OF ILLUSTRATIVE EMBODIMENTS

Figure 2:
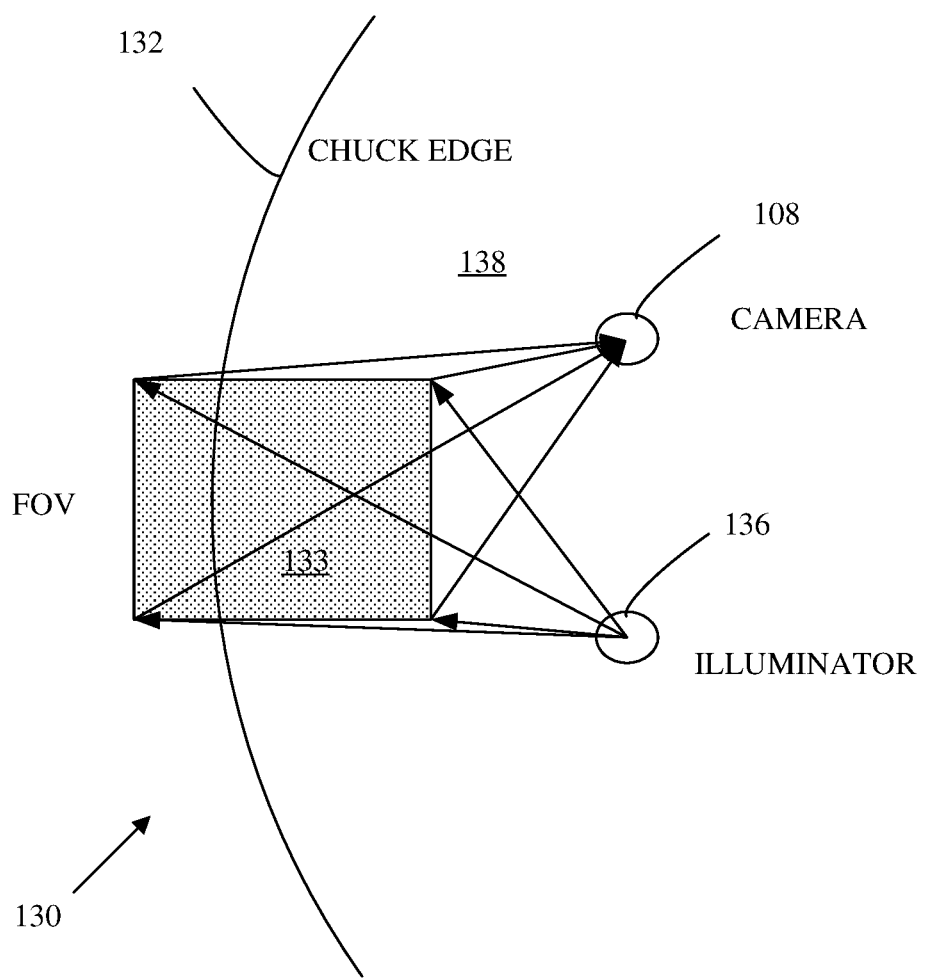
FIG. 2 is a diagrammatic view of an edge camera of an improved sensor imaging a portion of a chuck edge in the field of view (FOV) of the edge camera and the FOV is illuminated by a point source.

Known Auto-Teaching systems for semiconductor processing tools typically employ a single, centered camera that looks for a single, centered, circular object on the process chuck (the wafer platform). This camera looks almost perfectly straight down, normal to the sensor body. Relatively simple processing is used to locate the circular object in the camera image and compare its center to the calibrated sensor center. Illumination is provided by a ring light encircling the FOV of the camera.

In accordance with embodiments described herein, an auto-teaching wireless substrate-like sensor for semiconductor processing tools is provided with a plurality of cameras located near an outer edge of the sensor. The new system and method use one or more cameras located near the edge of the sensor to view the physical edge of the process chuck and measure its position and/or curvature relative to the sensor. Alignment marks visible to the one or more edge cameras may be used instead of the chuck edge or addition to it. These cameras may be used without a center camera or they may be used to supplement a center camera. The line of sight of these edge-viewing cameras must accommodate relatively large viewing angles to see the edge of a process chuck that is nominally the same diameter as the sensor. Because this view angle strongly couples lateral position (XY) with the distance from the camera to the process chuck (Z, or range), it is important to know Z (range) accurately in order to report accurate XY. In one embodiment, the Z range measurement is performed with structured illumination, so it is important that each edge camera be paired with and calibrated with an illuminator employing some kind of structured light. This structured light and calibration of camera and illuminator allows for accurate determination of the range to the chuck edge and compensation for lateral shift caused by slight changes in range. This also provides a way to calculate and report an accurate Z (separation) between the wireless substrate-like sensor and the process chuck surface at the location of the edge camera. Other embodiments of the present invention can use other methods for determining range from camera to chuck. An example of another method to obtain Z is through ultrasonic ranging or time-of-flight.

The camera views should, additionally, be calibrated to accurately relate the position of each field of view to all other fields of view and to a single, overall coordinate system of the sensor. One camera field of view, such as a central camera's field of view, may be used to define the single, overall coordinate system. Alternatively, the single, overall coordinate system may be defined based on physical features of the sensor, such as the outside edges of the sensor, alignment notches, or alignment holes.

Embodiments described herein generally leverage a plurality of cameras disposed on a substrate-like sensor in order to image a geometrical feature (such as an edge) of a process chuck. Thus, instead of using only a centered, circular marker, it is now possible to align the end effector and the process chuck using the detection of the edge of the process chuck, or other alignment markings near the edge. The wireless substrate-like sensor is shaped and sized similarly to the wafers to be processed. In addition, other alignment features within the views of the multiple cameras may be used as the reference for the system to automatically calculate the X & Y distances and, optionally, the Z distance and angular orientation, to re-center and realign the end effector FIGS. 1A-1C are diagrammatic views of a wireless substrate-like sensor with improved chuck edge detection in accordance with one embodiment. FIG. 1A shows a top view, while FIG. 1B shows a side view and FIG. 1C shows a bottom view.

FIGS. 1A and 1C show wireless substrate-like sensor 100 having a circular shape with a circular raised portion 102 that houses electronics (described in greater detail with respect to FIG. 4) therein. While embodiments of the present invention will generally be described where the substrate-like sensor has a circular shape (similar to circular wafers), it is expressly contemplated that other shapes can be used as well. The important aspect of the substrate-like feature is that it allows sensor 100 to move within the processing environment in the same way as substrates when they are processed. Thus, in a reticle processing facility, a substrate-like sensor may be shaped rectangularly. In the embodiment shown in FIGS. 1A and 1C, sensor 100 includes a base portion that preferably has the same diameter as processed wafers. In one example, the outer diameter is 300 mm for a processing system that processed 300 mm diameter wafers. In another embodiment, base portion 104 has a diameter of 200 mm for systems that process 200 mm wafers. Base portion 104 is preferably formed of a relatively rigid material such as carbon fiber or chemically hardened glass (such as Gorilla Glass available from Dow Corning of Midland, Mich.).

FIG. 1C shows a central camera 106 provided along with four additional cameras 108, 110, 112, and 114 disposed near the outer edge 116 of sensor 100. Sensor 100 also includes one or more structured illumination sources (shown in FIG. 2). Preferably, a structured illuminator or structured illumination source is provided for each of cameras 108, 110, 112, and 114. In the embodiment shown in FIG. 1C, four cameras 108, 110, 112, and 114 are disposed approximately 90 degrees apart near the edge 116 of sensor 100. However, those skilled in the art will recognize that more or fewer outer cameras can be used in accordance with embodiments of the present invention. Further, while the outer edge cameras 108, 110, 112, and 114 are spaced evenly from one another, it is also contemplated that embodiments of the present invention can be practiced where the spacing between the cameras is not equal.

FIG. 2 is a diagrammatic view of an edge camera, such as camera 108, of a wireless substrate-like sensor imaging a portion 130 of a process chuck edge 132 in the field of view (FOV) 134 of edge camera 108 as FOV 134 is illuminated by structured illuminator 136 (illustrated diagrammatically as a point source). This illustration is intended to show a camera and illuminator being paired. As set forth above, the pairing of the cameras and illuminators facilitates calibration of the camera which allows for accurate determination of the range to edge 132 of process chuck 138. Camera 108 may be any suitable device capable of obtaining a useful image of the field of view. Camera 108 may be a monochrome camera or a color camera. Generally, camera 108, as well as cameras 110, 112, and 114 are area array devices such as a Charge Coupled Device (CCD) or Complementary Metal Oxide Semiconductor (CMOS) image devices. These cameras may include or be coupled to suitable optical systems (not shown separately) to focus images upon the array within the camera.

Figure 3:
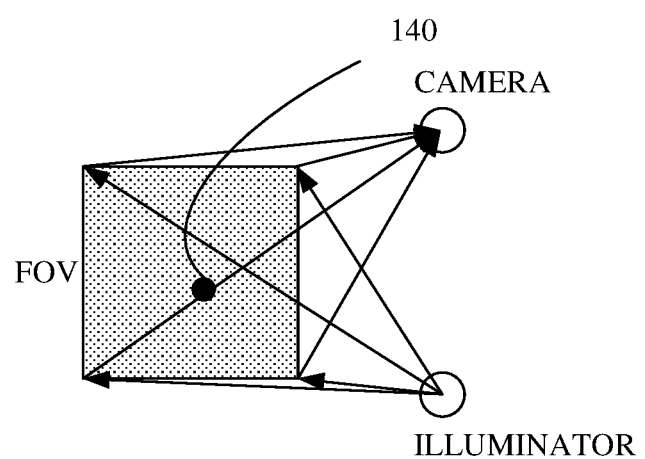
FIG. 3 is a diagrammatic view illustrating an example of structured light that can be imaged by the cameras, with the subsequent images processed by the sensor for accurate determination of range.

FIG. 3 is a diagrammatic view illustrating a very simple example of structured illumination that can be calibrated and used for accurate determination of range. In FIG. 3, the structured illumination is in the form of a single dot. Through calibration, the size and nominal position of dot 140 is known to the sensor controller (shown in FIG. 4). When an image of dot 140 is acquired by a camera, such as camera 108, contrasting the apparent size and location of dot 140 in the image with the known calibration information facilitates the camera/illuminator pair to be able to provide accurate range (i.e. distance to object) determinations. The position of the structured illumination in the camera's image relative to height is calibrated so that the observed position in the image can be processed to render an accurate Z measurement. FIG. 3 shows a simple example, but workers skilled in the art will recognize that the structured illumination pattern can take many forms, for example, but not limited to: a dot, more than one dot, a cross, a circle, multiple lines, sinusoidally varying patterns, diamonds, and a checkerboard.

Figure 4A:
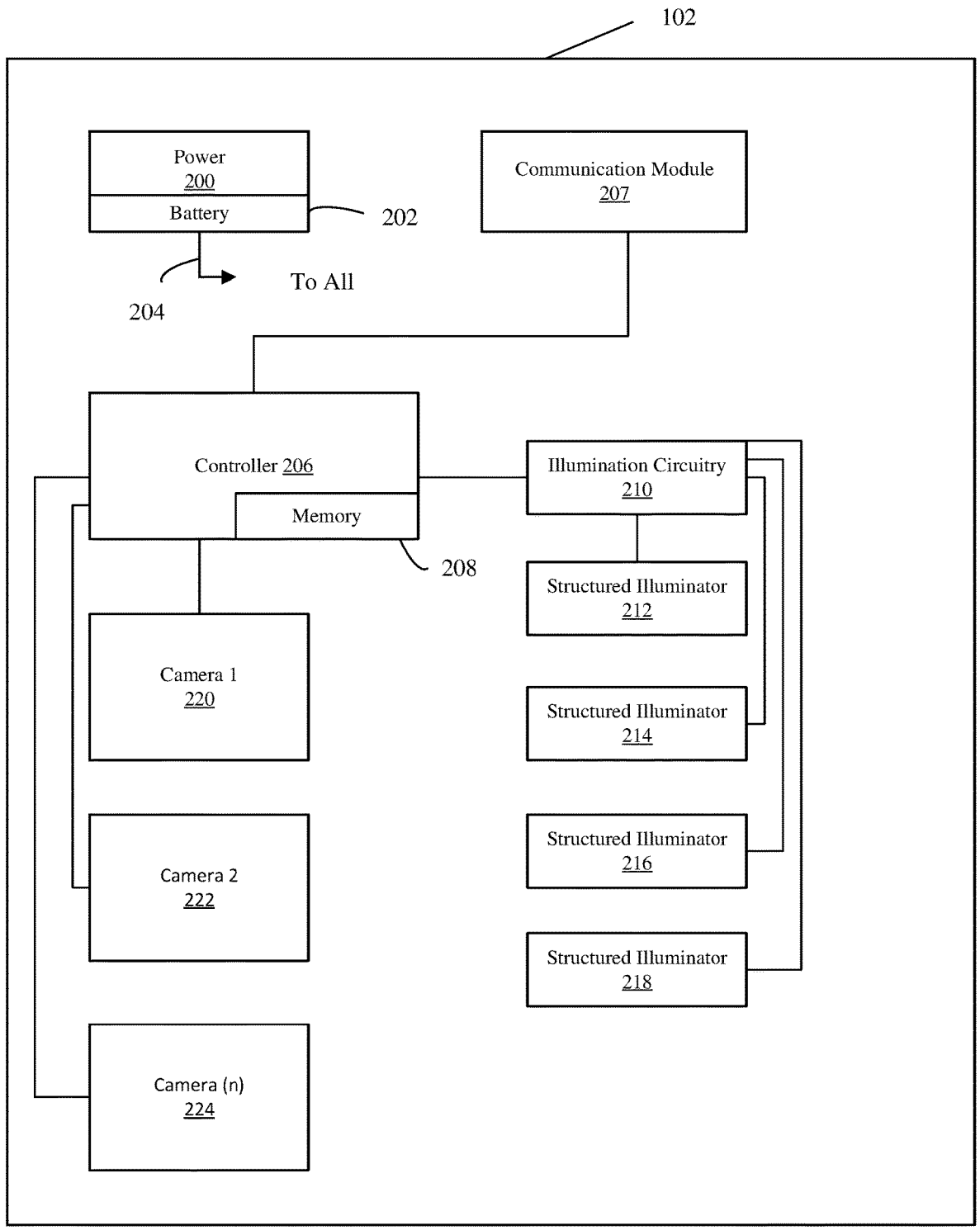
FIGS. 4A and 4B are diagrammatic views of a wireless wafer-shape teaching sensor in accordance with embodiments of the present invention.

FIG. 4A is a diagrammatic view of a wireless wafer-shape teaching sensor in accordance with an embodiment of the present invention. FIG. 4A is a diagrammatic view of circuitry within circular raised portion 102 in accordance with embodiments of the present invention. As shown, a power module 200 preferably includes a battery 202 in order to power sensor 100 as it moves within the semiconductor processing facility. Preferably, battery 202 is a rechargeable battery. Power module 200 is configured to provide requisite power to the various other components of sensor 100 as indicated by arrow 204 labelled "To All." In one example, power module 200 may include a power management integrated circuit available from Texas Instrument under the trade designation TPS5602.

Controller 206 is coupled to and receives power from power module 200. Controller 206 is configured, through hardware, software, or a combination thereof, to programmatically execute instructions in order to obtain image data from the cameras to which it is coupled. Controller 206 may be configured to employ communication circuitry 207 to transmit images to receiving hardware external to the sensor wafer, where they may be stored or processed. In the preferred embodiment, the sensor controller will execute processing to identify features in the images indicative of reference locations (e.g. edge portions of a process chuck), and calculate a reference position (i.e. center of a process chuck) based on the reference locations and stored calibration information. Further, controller 206 is configured to employ communication circuitry 207 to transmit information indicative of the reference position to a robotic handling system or other suitable device in order to teach the robotic handling system the reference position. In one example, controller is a microprocessor, such as that sold under the trade designation TMS320C6211 available from Texas Instruments. Controller 206 is also coupled to or includes memory 208, which can take the form of any type of memory. Preferably, however, memory 208 includes a module of Synchronous Dynamic Random Access Memory (SDRAM) preferably having a size of at least 16M×16. Memory 208 also preferably includes flash memory having a size of 256K×8. Flash memory is useful for storing such non-volatile data as programs, calibration data and/or additional other non-changing data as may be required. The random access memory is useful for storing volatile data such as acquired images or data relevant to program operation. Memory 208 contains instructions that when executed by controller 206 perform the functions described herein.

Illumination module 210 is coupled to controller 206 as well structured illuminators 212, 214, 216, and 218. Each structured illuminator 212, 214, 216, 218 is preferably located on the underside of base portion 104 near a respective camera 108, 110, 112, and 114. The structured illuminators generate illumination having a particular structure, such as shown in FIG. 3, that allows calibration of range for each camera/illuminator pair. The structured light illuminators may employ sufficient monochrome or polychromatic light to the camera FOV's to allow suitable images to be recorded. The structured illuminators may comprise LEDs, laser diodes, or any other suitable device.

As shown in FIG. 4A, controller 206 is coupled to all cameras 220, 222, and 224. Camera 220 may be a central camera similar to cameras used in the prior art. Further, in environments where camera 220 has an unobstructed view of a central aperture on a process chuck, controller 200 may perform coordinate teaching in using prior techniques. Controller 200 is also coupled to various edge cameras 222, 224 in order to provide coordinate teaching in accordance with embodiments of the present invention. Camera 224 is labeled "Camera(n)" in FIG. 4 to indicate that any suitable number of edge cameras 222, 224 can be used. Further, controller 200 may be adapted through hardware, software, or a combination thereof, to determine if camera 220 has an obstructed view or if no central aperture or feature is provided on a process chuck and automatically employ edge cameras for calculating a center of the process chuck.

Communication circuitry 207 is coupled to controller 206 to allow controller 206 to communicate, preferably bi-directionally, during operation within a semiconductor processing environment. Communication circuitry 207 can employ any suitable wireless communication protocol and/or frequency. In one example, communication circuitry operates at about 2.4 GHz in accordance with the well-known Bluetooth standard, Bluetooth Core Specification Version 1.1 (Feb. 22, 2001), available from the Bluetooth SIG (www.bluetooth.com). One example of circuitry 207 is available from Mitsumi under the trade designation WML-C11.

In order to provide higher accuracy and precision, embodiments described herein generally facilitate the calibration of each edge camera/illuminator pair such that range to the edge of the process chuck can be determined accurately and used to compensate for lateral shift caused by changes in range. In accordance with one embodiment, the sensor is placed in a precise jig or calibration fixture having a known range. The at least one edge camera is caused to record one or more images at one or more known ranges. Controller 206 then process the obtained image or images to associate the appearance of the structured illumination in the image or images to the known range. The calibration method builds calibration information that is used during teaching to measure the range from the appearance of structured light in images. This calibration information may be in the form of a lookup table or coefficients of a functional representation of the calibration information. Use of the calibration information by the controller may involve interpolation between stored calibration points or extrapolation beyond the range of the stored calibration. Further, since the sensor may be sensitive to environmental changes, the calibration information may contain dependences on ancillary measurements of temperature, humidity, pressure and other environmental variables.

Figure 4B:
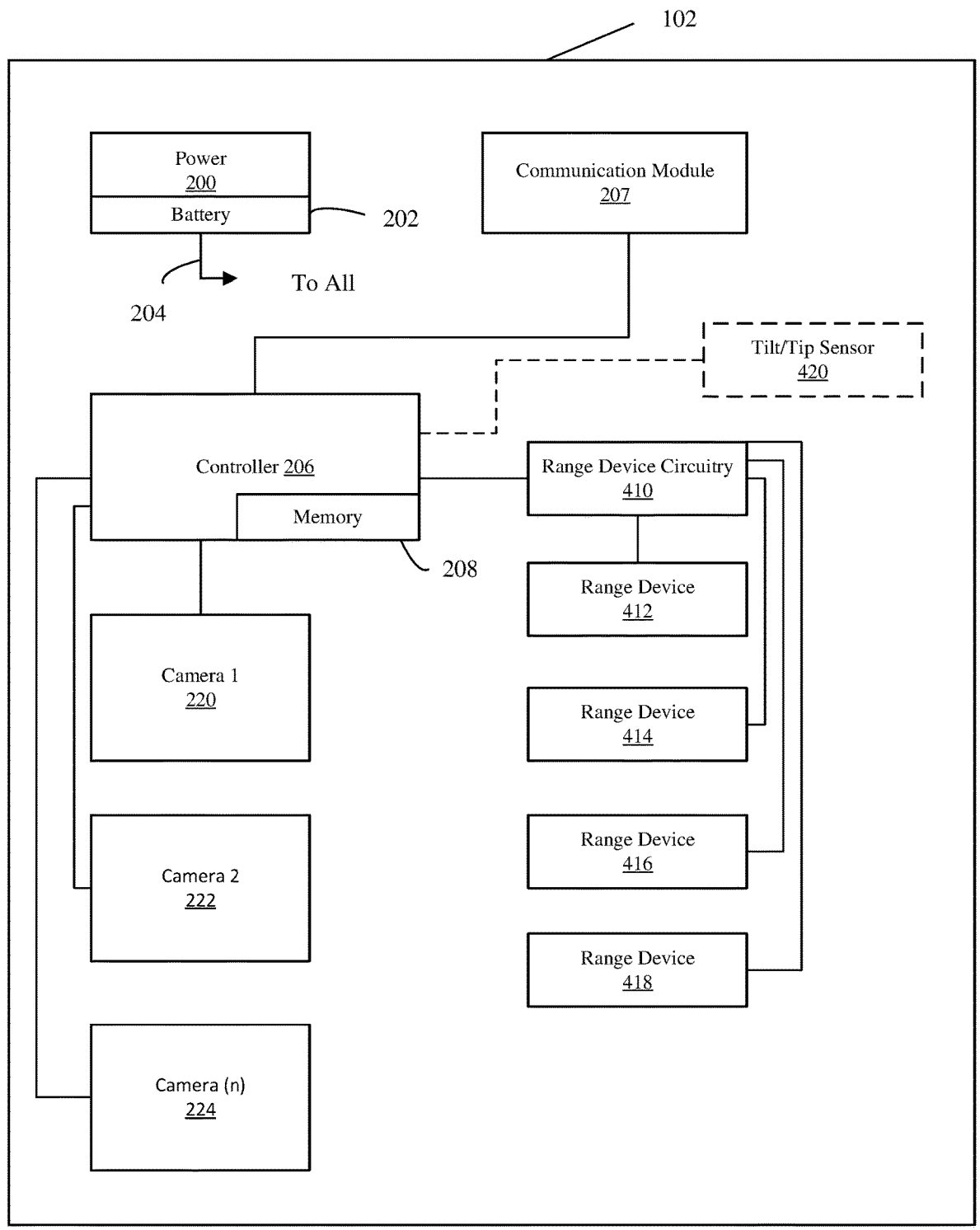

FIG. 4B is a diagrammatic view of a wireless wafer-shape teaching sensor in accordance with another embodiment of the present invention. The embodiment shown in FIG. 4B bears many similarities to the embodiment shown in FIG. 4A and like components are numbered similarly. The main difference between the embodiments, is that FIG. 4B shows that range devices 412, 414, 416, and 418 can be used instead of structured illuminators. These range devices can utilize any suitable techniques for determining range or distance from the wireless substrate-like sensor to the object or process chuck. In a preferred embodiment, range devices 412, 414, 416, and 418 are driven or otherwise controlled by range device circuitry 410, which is coupled to controller 206. While FIG. 4B shows a number of range devices being used, it is expressly contemplated that embodiments of the present invention can be practiced with a single range device in combination with a tilt/tip sensor 420 mounted to the wireless substrate-like sensor and coupled to the controller to provide an indication of the sensor's tilt/tip. Such a tilt/tip sensor could also be used in combination with a single structured illuminator, such as those described above.

Figure 5:
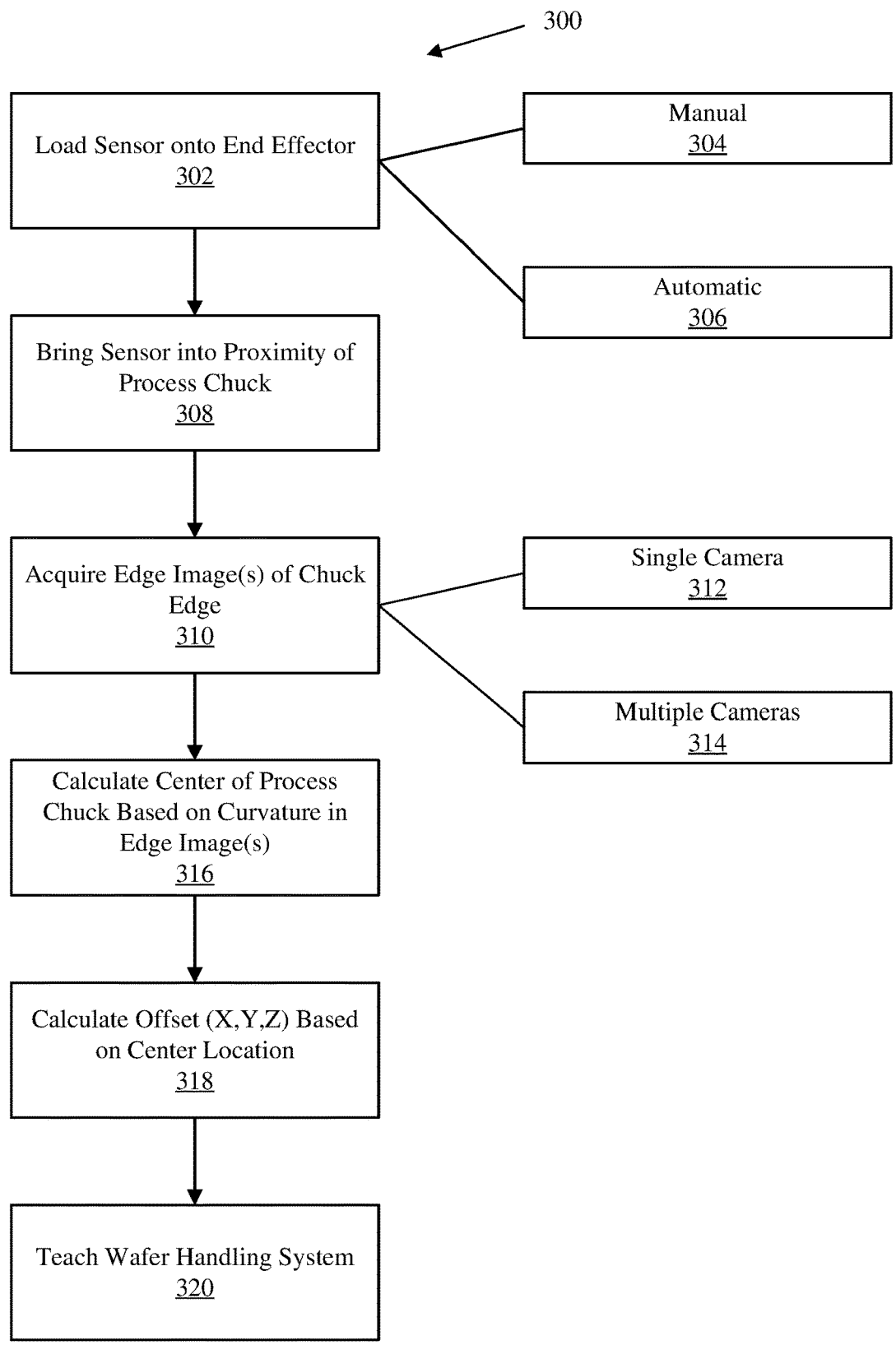
FIG. 5 is a flow diagram of a method of training a wafer handling robot in accordance with an embodiment of the present invention.

FIG. 5 is a flow diagram of a method of teaching a wafer handling robot in accordance with an embodiment of the present invention. Method 300 begins at block 302 where the sensor is loaded or otherwise disposed on an end effector of a semiconductor handling robot. This can be done manually 304 by a technician placing the sensor on the end effector, or automatically 306, by causing the semiconductor handling robot to withdraw the sensor from a known sensor location, such as a base station, or a location in a wafer handling cassette or pod. Next, at block 308, the sensor is brought by the semiconductor handling robot into proximity of a transfer position. As defined herein, a transfer position is any location in a semiconductor processing facility where a semiconductor substrate, such as a wafer or reticle, leaves an end effector of a semiconductor handling robot or is picked up or otherwise engaged by an end effector of a semiconductor handling robot. Accordingly, a process chuck is one such transfer position.

At block 310, the sensor acquires at least one edge image of the transfer position. In one example, the transfer position is a circular process chuck. As shown in block 312, it is believed that embodiments of the present invention can be practiced with a single camera having a FOV that covers an edge of the process chuck. For example, in the acquired image, the curved outer edge can be identified by an image processor, such as controller 206. The curved edge can be fit to a circle and the center found from the fit circle. Accordingly, even if the sensor cannot view the center of the process chuck, or if the center does not have a reference feature, such as an aperture, embodiments described herein can still provide automatic teaching of wafer transfer coordinates to the semiconductor handling system. While it is believed to be possible to practice embodiments of the present invention using a single edge camera, it is believed that higher accuracy can be achieved with multiple cameras as indicated at reference numeral 314 and shown in FIG. 1C.

Next, at block 316, a controller, such as controller 206 calculates a center position of the process chuck using one or more images of a curved edge of the process chuck. The center calculation can be done in any suitable manner. The circular edge arcs identified in each camera image can be combined and then mathematically fit to a single circle using methods stored in controller 206. Alternatively, each camera's edge arc can be fit to its own circle and the center of each camera's derived circle can be suitably combined to arrive a single center result. Adding additional edge cameras will further improve the accuracy of the sensor. Finally, at block 320, the sensor provides the calculated center coordinate to the handling system to teach the transfer position to the handling system. Preferably, this is done using wireless communication, such as using wireless communication circuitry 207.

Those skilled in the art will appreciate that a number of variations can be made without departing from the spirit and scope of the invention. Examples of variations include providing the structured illumination in various forms, such as sinusoids or repeating diamonds. Z range can be determined optically using structured illumination as described in detail above, but also through other means, such as ultrasonic or capacitive ranging, or a combination of ranging through various means at a single point combined with accurate determination of the relative inclination of the chuck and the sensor. Further, more than one camera can be associated with a single illumination source and/or more than one illumination source can be associated or paired with a single camera. The illumination of one or both illuminators can be at a single wavelength or at multiple wavelengths. Similarly, the cameras can be used to detected and potentially record color or monochrome images. Single or multiple images can be used to reach a desired XY position result. Finally, the height (Z) values can be used for a purpose that is separate from determining accurate X and Y.

Although the present invention has been described with reference to preferred embodiments, workers skilled in the art will recognize that changes may be made in form and detail without departing from the spirit and scope of the invention.

What is claimed is:

1. A wireless substrate-like sensor for teaching transfer coordinates to a robotic substrate handling system, the sensor comprising:
   a base portion sized and shaped like a substrate handled by the robotic substrate handling system:
   an electronics housing coupled to the base portion;
   a power module disposed within the electronics housing and configured to power components of the sensor;
   at least one edge camera disposed near an edge of the base portion, the at least one edge camera having a field of view that images an edge of a process chuck configured to receive a substrate within the field of view of the at least one edge camera of the wireless substrate-like sensor, wherein the at least one edge camera has a view angle that couples lateral (X, Y) location in an image with range (Z);

a range device mounted relative to the base portion and operably coupled to the controller to provide an indication of range between the wireless substrate-like sensor and the process chuck;

a controller disposed within the electronics housing coupled to the at least one edge camera and the range device, the controller being configured to obtain the image from the at least one edge camera and determine a location of the process chuck based on at least one image of the edge of the process chuck and the indication of range, wherein the controller is configured to determine a range-corrected (X, Y) location of the process chuck based on the at least one image and the indication of range (Z) to the process chuck and transmit the range-corrected location of the process chuck to the robotic substrate handling system to teach the robotic substrate handling system the determined position.

2. The wireless substrate-like sensor of claim 1, and further comprising an additional camera disposed in a central region of the base portion and configured to image a central portion of an object located underneath the wireless substrate-like sensor.

3. The wireless substrate-like sensor of claim 1, wherein the edge is a round edge.

4. The wireless substrate-like sensor of claim 1, and further comprising a tilt/tip sensor operably coupled to the controller to measure tip and tilt of the wireless substrate-like sensor.

5. The wireless substrate-like sensor of claim 4, wherein the controller is configured to utilize the indication of range and measurement of tip and tilt to correctly report XY coordinates from camera images.

6. The wireless substrate-like sensor of claim 1, wherein the at least one edge camera includes four edge cameras, each disposed proximate an edge of the base portion.

7. The wireless substrate-like sensor of claim 1, and further comprising a structured illuminator mounted relative to the base portion proximate at least one edge camera the structured illuminator being configured to generate structured illumination in a field of view of the at least one edge camera.

8. The wireless substrate-like sensor of claim 7, wherein the wireless substrate-like sensor comprises at least four edge cameras and a structured illuminator disposed proximate each respective edge camera.

9. The wireless substrate-like sensor of claim 7, wherein the structured illumination is in the form selected from the group consisting of a dot, a circle, a plus symbol, a plurality of parallel lines, a sinusoidally varying intensity pattern in at least one of X and Y direction, diamonds shapes, and a checkerboard.

10. The wireless substrate-like sensor of claim 7, wherein the structured illumination is configured to allow a calibration operation in order to calibrate apparent range based on the structured illumination.

11. The wireless substrate-like sensor of claim 10, wherein the controller is configured to perform the calibration operation for each pair of edge camera and structured illuminator.

12. The wireless substrate-like sensor of claim 10, wherein the controller is configured to utilize stored calibration information in order to accurately calculate range based on the appearance of the structured illumination in the camera images.

13. The wireless substrate-like sensor of claim 1, wherein the controller is configured to utilize measured range to correctly report XY coordinates from camera images.

14. The wireless substrate-like sensor of claim 1, wherein the controller is configured to employ a camera proximate to the center of the sensor base to attempt to image a central aperture of the process chuck and selectively engage the at least one edge camera if the attempt to image the central aperture of the object fails.

15. The wireless substrate-like sensor of claim 1, wherein the at least one edge camera is a monochrome camera.

16. The wireless substrate-like sensor of claim 1, wherein at least one edge camera is a color camera.

17. The wireless substrate-like sensor of claim 1, wherein the sensor has a form that is substantially similar to a semiconductor wafer.

18. The wireless substrate-like sensor of claim 1, wherein the sensor has a form that is substantially similar to a semiconductor process reticle.

19. A method of measuring the position of a process chuck of a semiconductor processing tool relative to a sensor held by a robotic manipulator of the semiconductor processing tool, the method comprising:

providing a sensor having at least one edge detecting camera and a range sensor, wherein the at least one edge camera has a view angle that couples lateral (X, Y) location in an image with range (Z);

causing the at least one edge detecting camera to obtain at least one image of a round outer surface of the process chuck;

causing the range sensor to detect a range to the process chuck;

calculating a range-corrected (X, Y) location of a center of the process chuck based on analyzing the at least one image of the round outer surface of the process chuck and the detected range (Z) to the process chuck; and communicating the calculated the range-corrected (X, Y) location of the process chuck to a controller of the robotic manipulator.

20. The method of claim 19, and further comprising providing a structured illuminator for each of the at least one edge camera and using the structured illumination to calibrate each camera/illuminator pair for range.

21. The method of claim 20, and further comprising using the calibrated sensor to obtain at least one subsequent image of the round outer surface of the process chuck.

22. The method of claim 19, and further comprising using stored calibration information to calculate lateral (XY) and range (Z) distances.

23. The method of claim 19, wherein communicating the calculated positon includes transmitting wireless data indicative of the calculated position to the controller of the robotic manipulator.

24. The method of claim 19, wherein the at least one edge detecting camera includes four edge detecting cameras, and wherein calculating the position of the chuck includes analyzing at least one image from each edge detecting camera.

25. A method of measuring the position of a process chuck within a semiconductor processing tool relative to a sensor held by a robotic manipulator of the semiconductor processing tool, the method comprising:

providing a sensor having at least one edge detecting camera and a range sensor wherein the at least one edge camera has a view angle that couples lateral (X, Y) location in an image with range (Z);

causing the at least one edge detecting camera to obtain at least one image of an alignment mark of the process chuck located within a field of view of the at least one camera;

causing the range sensor to detect a range to the process chuck;

calculating a range-corrected (X, Y) location of the alignment mark of the process chuck based on the at least one image of the alignment mark and the detected range (Z) to the process chuck; and communicating the calculated the range-corrected (X, Y) location to a controller of the robotic manipulator.

26. The method of claim 25, and further comprising providing a structured illuminator for each of the at least one edge camera and using structured illumination to calibrate each camera/illuminator pair for range.

27. The method of claim 26, and further comprising using the calibrated sensor to obtain at least one subsequent image of an edge of the process chuck.

28. The method of claim 25, and further comprising using stored calibration information to calculate lateral (XY) and range (Z) distances.

29. The method of claim 25, wherein communicating the calculated position includes transmitting wireless data indicative of the calculated position to the controller of the robotic manipulator.

30. The method of claim 25, wherein the at least one edge detecting camera includes four edge detecting cameras, and wherein calculating the position of the alignment mark includes analyzing at least one image from each edge detecting camera.

31. The wireless substrate-like sensor of claim 1, wherein the at least one edge camera is disposed on a bottom side of the base portion.

32. The wireless substrate-like sensor of claim 1, wherein the range device is disposed on a bottom side of the base portion.

33. The wireless substrate-like sensor of claim 7, wherein the structured illuminator is disposed on a bottom side of the base portion.

34. The method of claim 19, wherein providing the sensor comprises positioning the sensor, with the robotic manipulator, at a height above the process chuck to obtain the at least one image of the round outer surface of the process chuck.

35. The method of claim 19, wherein the sensor held by the robotic manipulator further comprises a tilt sensor, and wherein a signal of the tilt sensor is used, at least in part, to calculate the position of the center of the process chuck.

36. The method of claim 25, wherein the sensor held by the robotic manipulator further comprises a tilt sensor, and wherein a signal of the tilt sensor is used, at least in part, to calculate the position of the center of the process chuck.

* * * * *